(12) United States Patent
Park et al.

(10) Patent No.: US 7,522,648 B2
(45) Date of Patent: Apr. 21, 2009

(54) HYBRID TYPE INTEGRATED OPTICAL DEVICE

(75) Inventors: Mahn Yong Park, Daejeon (KR); Byoung Whi Kim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 352 days.

(21) Appl. No.: 11/139,763

(22) Filed: May 26, 2005

(65) Prior Publication Data
US 2006/0093002 A1 May 4, 2006

(30) Foreign Application Priority Data
Nov. 3, 2004 (KR) .................. 10-2004-0089059

(51) Int. Cl.
*H01S 5/00* (2006.01)
(52) U.S. Cl. .................. 372/50.1; 385/14; 385/15; 385/30; 385/50
(58) Field of Classification Search ...... 372/50.1–50.23
See application file for complete search history.

(56) References Cited

U.S. PATENT DOCUMENTS

| | | | |
|---|---|---|---|
| 5,488,678 A * | 1/1996 | Taneya et al. .................. | 385/14 |
| 5,684,902 A * | 11/1997 | Tada .................. | 385/88 |
| 6,132,107 A | 10/2000 | Morikawa | |
| 6,217,231 B1 * | 4/2001 | Mesaki et al. .................. | 385/88 |
| 6,331,908 B1 * | 12/2001 | Adams et al. .................. | 398/200 |
| 6,391,214 B1 | 5/2002 | Kovacic | |
| 6,693,936 B2 | 2/2004 | Kitaoka et al. | |
| 6,987,913 B2 * | 1/2006 | Blauvelt et al. .................. | 385/50 |
| 2002/0114577 A1 | 8/2002 | Kondo et al. | |
| 2004/0121520 A1 * | 6/2004 | Karkkainen .................. | 438/107 |

FOREIGN PATENT DOCUMENTS

| | | |
|---|---|---|
| JP | 60-257413 | 12/1985 |
| KR | 2001-0010805 | 2/2001 |
| KR | 1020030078516 | 10/2003 |

* cited by examiner

*Primary Examiner*—Minsun Harvey
*Assistant Examiner*—Tod T Van Roy
(74) *Attorney, Agent, or Firm*—Blakely, Sokoloff, Taylor & Zafman LLP (57) ABSTRACT

A hybrid type integrated optical device has a semiconductor laser mounted on a planar waveguide platform by flip-chip bonding. The optical device comprises a semiconductor laser and a planar waveguide platform. The semiconductor laser includes a first structure, which has an active region and a light emission surface formed on at least one side surface of the first structure, and a second structure, which is formed below the first structure and has upper surfaces exposed at the light emission surface of the first structure and/or to a surface opposite to the light emitting surface. The planar waveguide platform includes a substrate, a lower clad layer, a core layer, and an upper clad layer, being sequentially stacked on the substrate. The semiconductor laser is flip-chip bonded on the substrate, such that the exposed upper surfaces of the second structure contact the upper surface of the upper clad layer.

13 Claims, 9 Drawing Sheets

HYBRID TYPE INTEGRATED OPTICAL DEVICE

RELATED APPLICATIONS

The present application is based on, and claims priority from, Korean Application Number 2004-89059, filed Nov. 3, 2004, the disclosure of which is incorporated by reference herein in the entirety.

BACKGROUND OF THE INVENTION

1. Field of the Invention

The present invention relates to a hybrid type integrated optical device, which has a semiconductor laser mounted on a planar waveguide platform by flip-chip bonding, and more particularly to a hybrid type integrated optical device, designed to allow effective vertical alignment of an optical axis of a semiconductor laser and to reproducibly reduce an air gap between a planar waveguide platform and the semiconductor laser so as to provide high optical coupling efficiency between the planar waveguide platform and the semiconductor laser.

2. Description of the Related Art

Hybrid type integrated optical devices are generally manufactured by coupling a semiconductor laser and a planar waveguide platform by flip-chip bonding, and are used for various optical applications. Common examples include 1.31 µm/1.55 µm bi-directional optical transceiver modules, 1.31 µm/1.49 µm/1.55 µm triplexer optical transceiver modules, high velocity channel selectors using semiconductor optical amplifiers, multiple-channel optical transceiver module/optical monitor devices, which have a waveguide arrangement diffraction grating and a semiconductor laser chip or a semiconductor optical detector chip integrated thereon, and the like.

Figure 1:
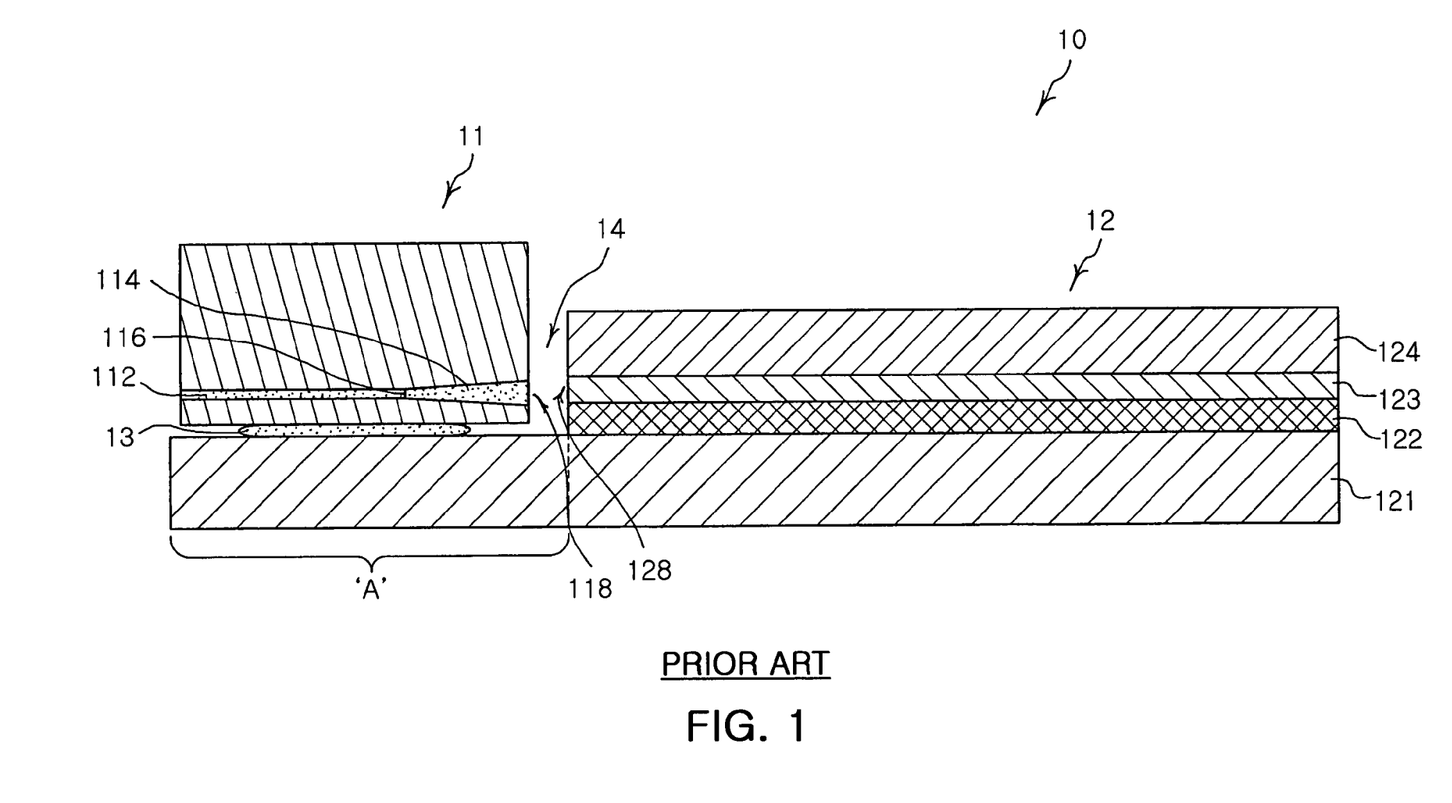
FIG. 1 is a cross-sectional view illustrating a conventional hybrid type integrated optical device.

FIG. 1 is a cross-sectional view of a conventional hybrid type integrated optical element. Referring to FIG. 1, the conventional hybrid type integrated optical element comprises a semiconductor laser 11 mounted on a predetermined region A of a planar waveguide platform 12 by flip-chip bonding.

The planar waveguide platform 12 has a substrate 121, a lower clad layer 122, a core layer 123, and an upper clad layer 124 sequentially stacked in this order on the substrate 121, and has a region A for mounting the semiconductor laser 11 thereon using flip-chip bonding. The region A to which the semiconductor laser 11 is flip-chip bonded can be formed by selectively removing a predetermined portion of the lower clad layer 122, the core layer 123, and the upper clad layer on the predetermined region A after laminating the lower clad layer 122, the core layer 123, and the upper clad layer on the substrate 121. Then, a metallic pattern, an alignment pattern, and the like are formed on the flip-chip bonded region A by a semiconductor photolithography process.

The semiconductor laser 11 is welded to an upper surface of the flip-chip bonded region A on the planar waveguide platform 12 by use of a welding metal 13. In general, the welding metal 13 includes under bump metal (UMB), and a solder (Au/Sn). Upon flip-chip bonding, the welding metal 13 is heated to a temperature of about 280° C. or more, and fused, thereby allowing the semiconductor laser 11 to be welded to the substrate 121 of the planar waveguide platform 12.

Light generated from an active region 112 of the semiconductor laser 11 is optically coupled to a side surface 128 of the planar waveguide platform 12 through a light emission surface 118 of the semiconductor laser 11. The light emission surface 118 of the semiconductor laser 11 and the other side surface opposite to the light emission surface 118 have an antireflection film and a high-reflection film coated thereon, respectively, according to performance and objects of devices to be manufactured.

As shown in FIG. 1, when manufacturing the hybrid type integrated optical device, which has the semiconductor laser 11 bonded to the predetermined region A of the planar waveguide platform 12 in a passive alignment by flip-chip bonding, it is necessary to provide accurate alignment of an optical axis in the vertical and horizontal directions for ensuring effective optical coupling, and to reduce an air gap 14 between the light emission surface 118 of the semiconductor laser 11 and the side surface 128 of the planar waveguide platform 12 facing each other.

Conventionally, a silicon or silica terrace has been provided to a substrate of the optical device for alignment of the optical axis in the vertical direction, so that the semiconductor laser is flip-chip bonded to the terrace so as to be flush with the planar waveguide in the vertical direction, and an alignment mark has been used for alignment of the optical axis in the horizontal direction.

When welding the semiconductor laser 11 to the substrate by the flip-chip bonding method, an alignment error, which can be created by the conventional optical alignment method, is within ±2 µm in the vertical/horizontal directions. In order to prevent reduction in optical coupling efficiency due to such an alignment error, conventionally, an optical mode size converter (which is also referred to as a "spot size converter") 114 is provided within the semiconductor laser 11, and converts a spot size of light output from the active region 112 to a larger spot size of light. The optical mode size converter 114 acts to convert an optical mode (that is, spot size) of light generated from the active region 112 of the semiconductor laser 11, and to transfer the converted light to the light emission surface 118.

Typically, the optical mode size converter 114 is provided in the waveguide by reducing the size of the waveguide in the vertical and/or horizontal directions. The performance of the optical mode size converter 114 can be evaluated with a far-field angle. At this time, for a wide far-field angle, the optical coupling efficiency is varied depending on the size of the air gap 14 between the light emission surface 118 of the semiconductor laser 11 and the side surface 128 of the planar waveguide platform 12 facing each other. Thus, in order to achieve reproducible optical coupling efficiency, the air gap 14 must be accurately controlled in size upon flip-chip bonding.

However, in a typical process of manufacturing the semiconductor laser 11, since a single chip is provided by cleaving a plurality of semiconductor chips formed on a wafer, an error of about ±30 µm is created to the length of the semiconductor laser 11 with reference to a target value. Due to such an error in the process of manufacturing the semiconductor laser 11, the air gap 14 can have a size varied in the range of about ±30 µm, thereby causing a problem of variation up to 50%, in optical coupling efficiency between the semiconductor laser 11 and the planar waveguide 12.

In order to solve the problem, there has been investigation into integration of an optical mode size converter 114, which reduces the far-field angle of light transferred through the light emission surface 118 of the semiconductor laser 11 to the maximum extent, into a semiconductor laser chip. With regard to this, it is necessary to accurately form tapers of the waveguide of the optical mode size converter 114 in both vertical and horizontal directions in order to reduce the far field angle. Additionally, since internal reflection can occur at a butt-joint region 116 where the waveguide of the active region 112 of the semiconductor laser 11 meets the waveguide within the optical mode size converter 114, it is necessary to provide accurate control over deposition and patterning processes for respective regions. As such, accuracy required for the process of manufacturing the optical mode size converter causes a problem of raising the price of the semiconductor together with the price of the hybrid type integrated optical device manufactured by use of the semiconductor laser.

SUMMARY OF THE INVENTION

The present invention has been made to solve the above problems, and it is an object of the present invention to provide a hybrid type integrated optical device, designed to enhance optical coupling efficiency by reproducibly reducing a size of an air gap between a semiconductor laser and a planar waveguide platform.

It is another object of the present invention to provide the hybrid type integrated optical device, designed to reduce requirement dimensions of an optical mode size converter within the semiconductor laser used in the hybrid type integrated optical device, thereby reducing prices of the semiconductor laser and of the hybrid type integrated optical device with the semiconductor laser bonded thereto by a flip-chip bonding method.

In accordance with one aspect of the present invention, the above and other objects can be accomplished by the provision of a hybrid type integrated optical device, comprising: a semiconductor laser including a first structure having an active region and a light emission surface formed on at least one side surface of the first structure, and a second structure formed below the first structure and having upper surfaces exposed at the light emission surface of the first structure and/or at the other side surface opposite to the light emitting surface; and a planar waveguide platform including a substrate, a lower clad layer, a core layer, an upper clad layer, being sequentially stacked in this order on the substrate such that some region of the substrate is exposed, and a metallic pattern formed on the exposed region of the substrate, wherein the semiconductor laser is flip-chip bonded to the metallic pattern, such that the exposed upper surfaces of the second structure contact the upper surface of the upper clad layer of the planar waveguide platform.

The semiconductor laser may have a planar buried heterojunction structure, and may further comprise an optical mode size converter between the active region and the light emission surface. The first structure may have a height of 6 μm or more. Additionally, the light emission surface of the semiconductor laser may have an antireflection film coated thereon, and a high-reflection film coated on the other side of the light emission surface opposite to the light emission surface.

When the semiconductor laser is bonded to the planar waveguide platform, a filling material may be filled between the exposed upper surfaces of the second structure and the upper surface of the upper clad layer of the planar waveguide platform. Alternatively, the filling material may be filled between the exposed upper surfaces of the second structure and the upper clad layer of the planar waveguide platform and between a side surface of the first structure and a side surface of the planar waveguide platform facing the side surface of the first structure.

In order to provide vertical alignment of an optical axis of the semiconductor laser and the planar waveguide platform, the upper clad layer of the planar waveguide platform may have a bonding region removed to a predetermined depth, and the semiconductor laser may be flip-chip bonded to the bonding region such that the exposed upper surfaces of the second structure are bonded to an upper surface of the bonding region. At this time, the filling material may be filled between the exposed upper surfaces of the second structure and the upper surface of the upper clad layer of the planar waveguide platform, and alternatively, the filling material may be filled between the exposed upper surfaces of the second structure and the upper clad layer of the planar waveguide platform and between the side surface of the first structure and the side surface of the planar waveguide platform facing the side surface of the first structure, thereby allowing the semiconductor laser to be flip-chip bonded to the planar waveguide platform.

The filling material used for bonding between the semiconductor laser and the platform may be an epoxy material selected from the group consisting of a thermosetting epoxy material, an ultraviolet cured epoxy material, and the combination thereof. When the filling material is filled between the side surface of the first structure and the side surface of the planar waveguide platform facing the side surface of the first structure, the difference between an effective refractive index of the filling material and that of the core layer of the planar waveguide platform may be 0.1 or less for refractive index matching.

In order to fill the filling material, the planar waveguide platform may have at least one filling material conserving region formed by removing a portion of the upper clad layer to a predetermined depth, and at least one trench region formed by removing another portion the upper clad layer to a predetermined depth between the filling material conserving region and the bonding region. The filling material conserved in the filling material conserving region may flow to the bonding region along the trench region to be filled between the exposed upper surface of the second structure and the upper surface of the bonding region of the upper clad layer of the planar waveguide platform, and between the side surface of the first structure and the side surface of the planar waveguide platform facing the side surface of the first structure.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Preferred embodiments will now be described in detail with reference to the accompanying drawings.

Figure 2:
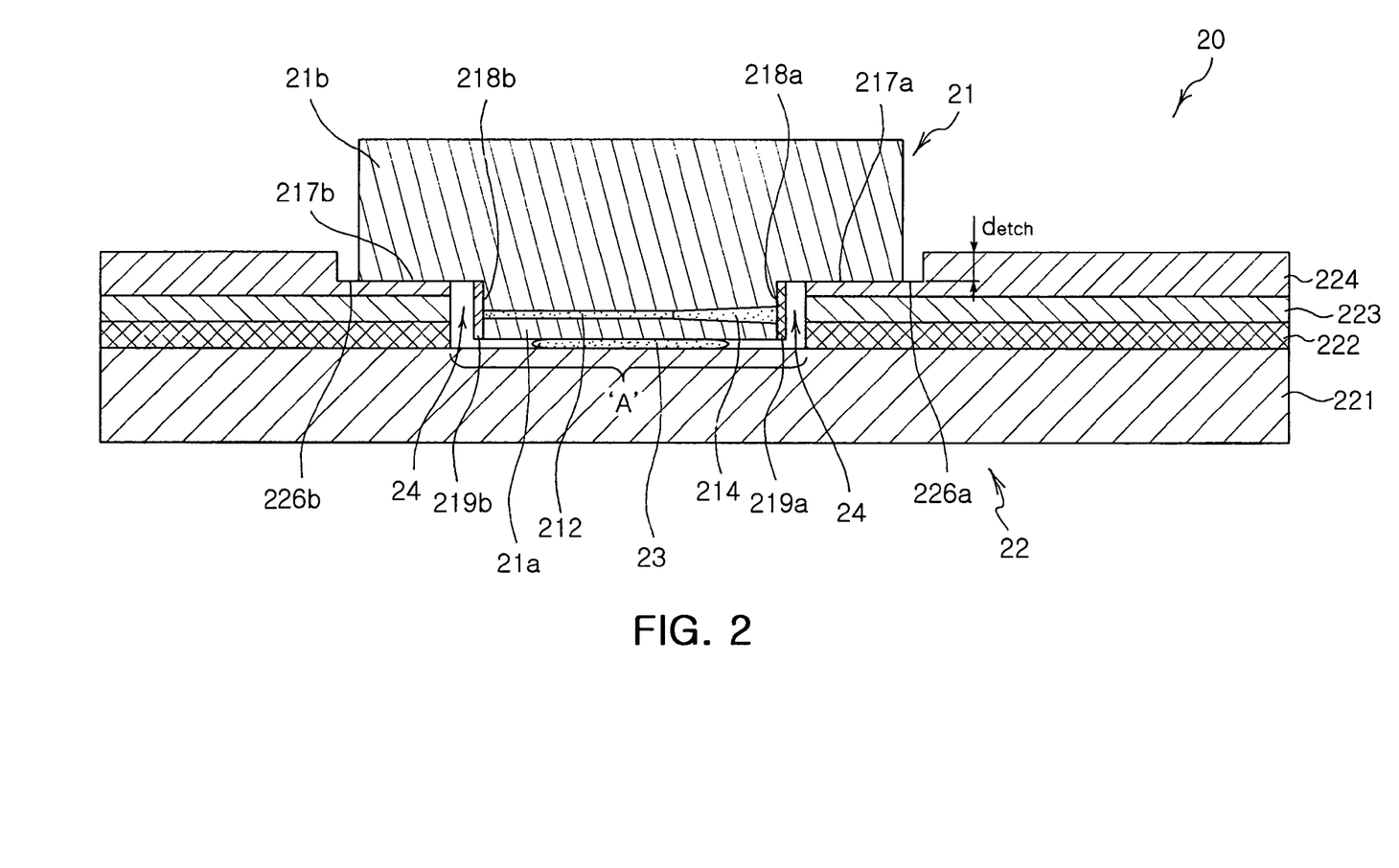
FIG. 2 is a cross-sectional view illustrating a hybrid type integrated optical device according to one embodiment of the present invention.

FIG. 2 is a cross-sectional view illustrating a hybrid type integrated optical device according to one embodiment of the present invention. Referring to FIG. 2, the hybrid type integrated optical device according to the present embodiment comprises: a semiconductor laser 21 including a first structure 21a, which has an active region 212 and a light emission surface 218a formed on at least one side surface of the first structure 21a, and a second structure 21b, which is formed below the first structure 21a and has upper surfaces 217a and 217b respectively exposed at the light emission surface 218a and the other side surface opposite to the light emitting surface 218a; and a planar waveguide platform 22 including a substrate 221, a lower clad layer 222, a core layer 223, an upper clad layer 224, sequentially stacked in this order on the substrate 221 such that a predetermined region A of the substrate 221 is exposed, and a metallic pattern 23 formed on the exposed region A on the substrate 221. The semiconductor laser 21 is flip-chip bonded to the metallic pattern 23, such that the exposed upper surfaces 217a and 217b of the second structure 21b contact bonding regions 226a and 226b formed by removing an upper surface of the upper clad layer 224 of the planar waveguide platform 22 to a predetermined depth $d_{etch}$. The semiconductor laser 21 comprises an optical mode size converter 214 between the active region 212 and the light emitting surface 218a.

FIG. 2 shows a flip-chip bonding structure of the semiconductor laser 21, in which the first structure 21a of the semiconductor laser 21 is shown located below the second structure 21. However, in the specification, it will be described that the first structure 21a is formed above the second structure 21b for convenience of description. Accordingly, it should be understood that the term "upper" related to the semiconductor laser is limited in its usage to the semiconductor laser in the specification.

Figure 3:
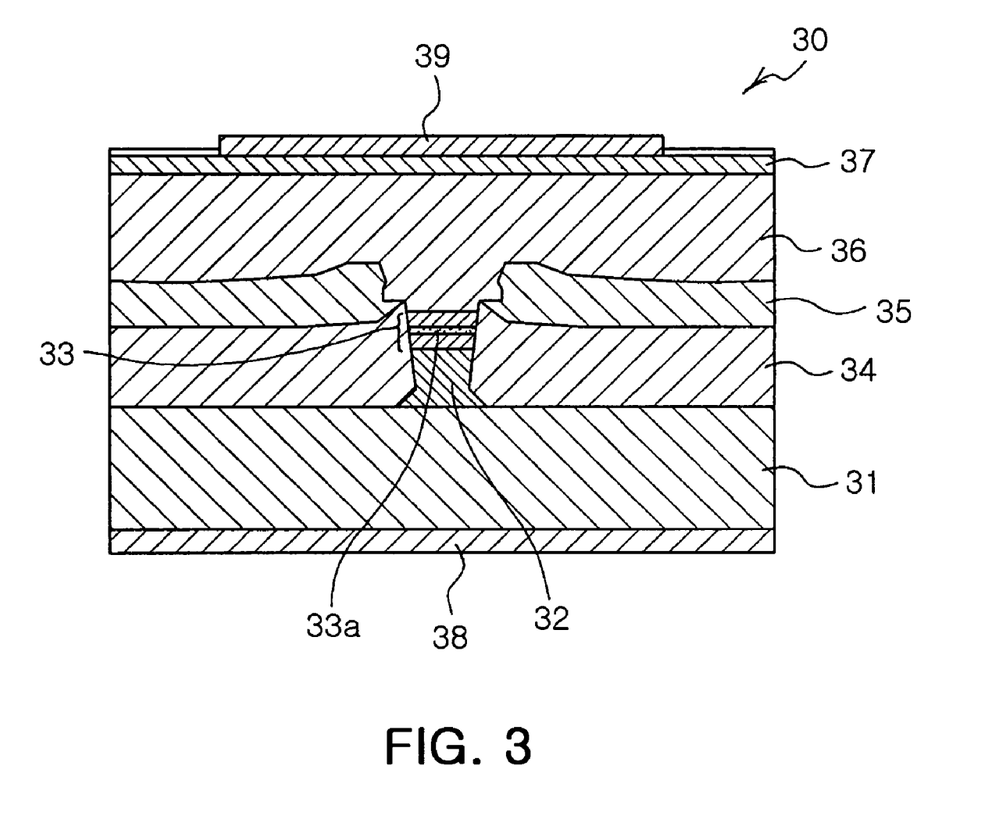
FIG. 3 is a cross-sectional view illustrating one example of a semiconductor laser having a planar buried hetero-junction structure.

Since the hybrid type integrated optical device is mainly used as a light source for optical communication, the semiconductor laser 21 is preferably a laser semiconductor having a planar buried hetero-junction structure, which allows high-speed modulation. The semiconductor laser of the planar buried hetero-junction structure has current shielding layers formed on both side surfaces of the active region formed between the clad layers, and prevents electric current from expanding upon operation, thereby providing advantages of a lower oscillation starting current, a higher quantum efficiency, and higher temperature characteristics. Such a semiconductor laser of the planar buried hetero-junction structure will be more apparent with reference to FIG. 3. FIG. 3 is a cross-sectional view illustrating one example of the semiconductor laser having the planar buried hetero-junction structure. Referring to FIG. 3, an active region 33 comprises multiple quantum wells 33a, so that electrons and holes injected from an n-type electrode 38 and a p-type electrode 39 are recombined in the multiple quantum wells 33a, thereby generating light. The active region 33 is formed to have a refractive index about 0.2~0.3 larger than that of a region surrounding the active region 33, so that a waveguide is formed along the active region 33, and light generated from the multiple quantum wells 33a spreads along the active region 33. In FIG. 3, reference numeral 31 denotes an n-type semiconductor substrate, reference numeral 32 denotes an n-type clad layer, reference numeral 34 denotes a p-type current shielding layer, reference numeral 35 denotes an n-type current shielding layer, reference numeral 36 denotes a p-type clad layer, and reference numeral 37 denotes an ohmic contact layer.

Referring to FIG. 2 again, the semiconductor laser 11 of the present invention further comprises an optical mode size converter 214, which converts an optical spot size of light generated from the active region 212, and then outputs the converted light to the light emitting surface 218a. The optical mode size converter 214 is in contact with the active region 212, and may be manufactured as lateral down tapers formed by gradually reducing a width of the waveguide defined within the active region 212, as vertical down tapers formed by gradually reducing a height of the waveguide, or as an appropriate combination thereof.

The semiconductor laser 21 according to the invention includes the first structure 21a, which has the active region 212 and the light emission surface 218a formed on at least one side surface of the first structure 21a, and the second structure 21b, which is formed below the first structure 21a and has upper surfaces 217a and 217b respectively exposed at the light emission surface 218a and the other side surface opposite to the light emitting surface 218a. The exposed upper surfaces 217a and 217b of the second structure 21b contact an upper surface of the upper clad layer 224 of the planar waveguide platform 22 (or the bonding regions 226a and 226b formed by removing some portion of the upper surface of the upper clad layer 224 of the planar waveguide platform 22 to the predetermined depth) upon the flip-chip bonding of the semiconductor laser 21.

Figure 4:
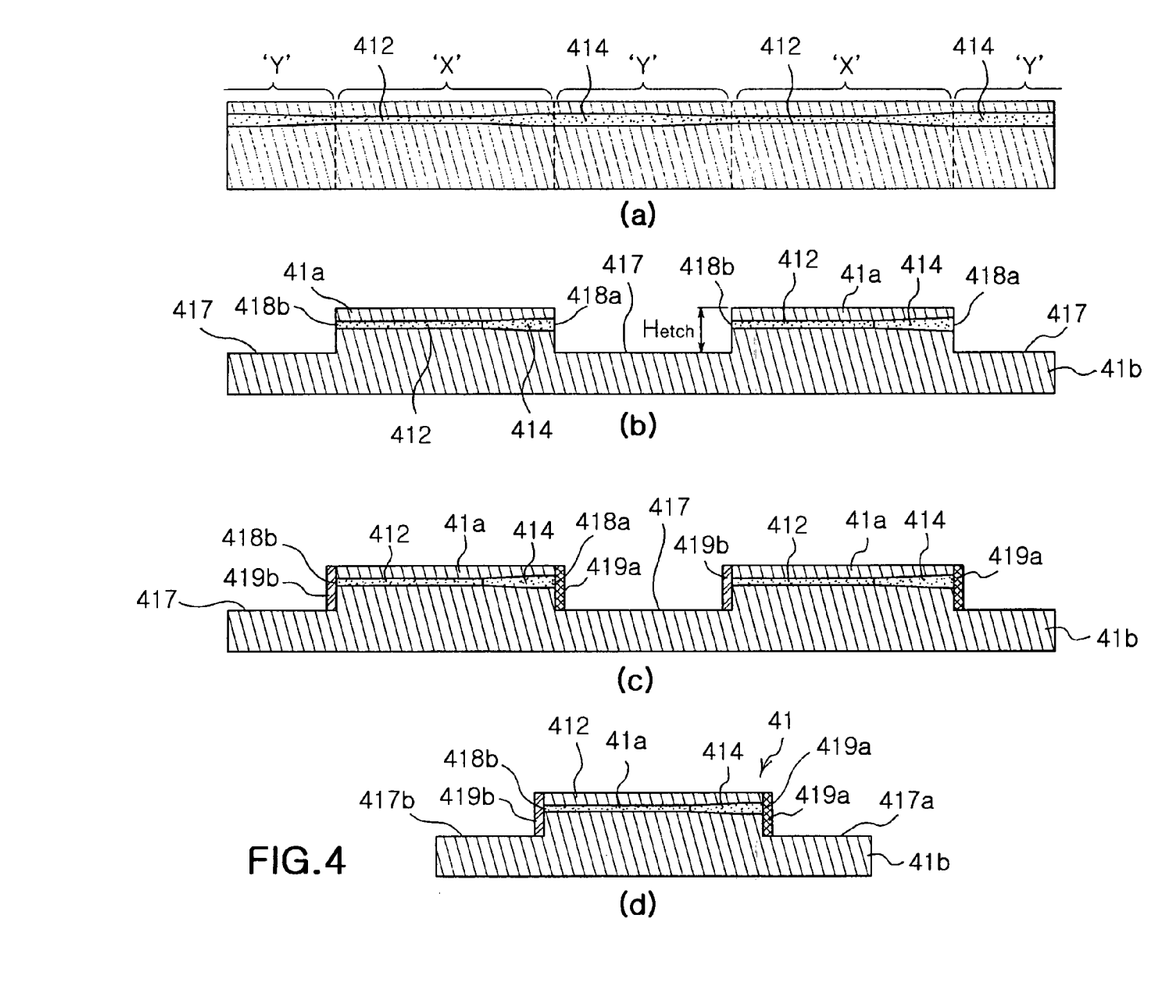
FIGS. 4a to 4d are step diagrams illustrating a method of manufacturing a semiconductor laser according to the present invention.

The first and second structures 21a and 21b may be formed by removing some portion of the first structure 21a after manufacturing the first and second structures 21a and 21b as one chip, rather than separate processes. FIGS. 4a to 4d are step diagrams illustrating a method of manufacturing a semiconductor laser according to the present invention. First, as shown in FIG. 4a, a plurality of semiconductor lasers is formed on one n-type semiconductor wafer (substrate). At this time, regions X, each of which has an active region 412 and an optical mode size converter 414, and regions Y, which will be removed by post-processes, are determined.

Then, as shown in FIG. 4b, first structures 41a, each of which includes the active region 412 and then optical mode size converter 414 while having a light emission surface 418a exposed to the outside, and second structures 41b, each of which is formed below the first structure 41a, are formed by removing the regions Y to a predetermined depth $H_{etch}$. In the present embodiment, the regions Y are removed by both semiconductor photolithography process and dry etching process. That is, a mask is formed on an upper surface of the regions X on which the first structures 41a will be formed, and then, the regions Y are removed by the dry etching process to the predetermined depth $H_{etch}$ by use of this mask as an etching mask. As a result, each of the second structures 41b has upper surfaces 417 exposed at the light emission surface 418a and the other side surface 418b opposite to the light emitting surface 418a of an associated first structure 41a. The depth in each of the region Y is a depth to provide a waveguide defined within the region Y, and is preferably 6 μm or more. That is, a height of the first structure 41a is preferably 6 μm or more. The dry etching can be conducted by use of $Cl_2$, $H_2$, Ar, $CH_4$ and the like with well-known RIE or ICP equipment.

Then, as shown in FIG. 4c, an antireflection film 419a and a high-reflection film 419b are coated on the light emission surface 418a and the other side surface 418b opposite to the light emitting surface 418a, respectively. The antireflection film 419a acts to enhance light extraction efficiency by preventing light emitted from the light emission surface 418a from being reflected, and the high-reflection film 419b acts to enhance light extraction efficiency by reflecting the generated light to the light emission surface 418a. The antireflection film 419a and the high-reflection film 419b may be located at different positions or be omitted according to the application of the semiconductor laser. For example, in the case where both side surfaces of the semiconductor laser are used for the light emission surface, the antireflection films may be coated on both side surfaces of the semiconductor laser. The antireflection film 419a and the high-reflection film 419b can be coated thereon by a well-known deposition process, including sputtering, e-beam deposition, chemical vapor deposition (CVD), and the like.

Finally, as shown in FIG. 4d, a single semiconductor laser 41, comprising the first structure 41a, which includes the active region 412 and the optical mode size converter 414, and the second structure 41b, which has the upper surfaces 417 exposed at the light emission surface 418a and the other side surface 418b opposite to the light emitting surface 418a of the first structure 41a, is completed by cleaving the semiconductor lasers 41 on the wafer at appropriate positions on the exposed upper surfaces 417.

Referring to FIG. 2 again, the planar waveguide platform 22, to which the semiconductor laser 21 is flip-chip bonded, includes the substrate 221, the lower clad layer 222, the core layer 223, the upper clad layer 224, sequentially stacked on the substrate 221 such that the predetermined region A of the substrate 221 is exposed, and the metallic pattern 23 formed on the exposed region A on the substrate 221.

The planar waveguide platform 22 may be formed by sequentially depositing the lower clad layer 222 and the core layer 223 on the substrate 221 consisting of a semiconductor material, selectively etching the core layer 223 so as to form a desired waveguide pattern, and then depositing the upper clad layer 224 on an overall surface of the lower clad layer 222 and the core layer 223.

The semiconductor laser 21 is flip-chip bonded to the region A of the planar waveguide platform 22, and the region A may be formed by selectively removing a predetermined portion of the lower clad layer 222, the core layer 223, and the upper clad layer 224 so as to expose the substrate 221. The metallic pattern 23 may be formed on the exposed region A of the substrate 221 in order to allow the semiconductor laser 41 to be weld to the region A by flip-chip bonding. Depending on the material of the planar waveguide platform 22, the planar waveguide platform 22 may be formed in such a manner that, after initially forming the metallic pattern 23 on the substrate 221, the lower clad layer 222, the core layer 223, and the upper clad layer 224 are sequentially deposited on the metallic layer 23, followed by removing the predetermined portion of the lower clad layer 222, the core layer 223, and the upper clad layer 224 by means of dry etching such that the metallic pattern 23 is exposed.

Although the region A having the metallic pattern 23 formed thereon for flip-chip bonding is located substantially at the center of the planar waveguide platform 22 in FIG. 2, the present invention is not limited to this structure. Instead, it should be apparent to those having ordinary knowledge in the art that the location of the region A is varied according to implementation of the present invention.

The hybrid type integrated optical device 20 is completed by joining the semiconductor laser 21 to the planar waveguide platform 22 structured as described above by the flip-chip bonding method. More specifically, the semiconductor laser 21 is coupled to the planar waveguide platform 22, such that a p-type electrode (not shown) formed on the uppermost portion of the semiconductor laser 21 is welded to the metallic pattern 23 on the substrate of the planar waveguide platform 22, and such that the exposed upper surfaces 217a and 217b of the second structure 21b of the semiconductor laser 21 are bonded to the upper surface of the upper clad layer 224 of the planar waveguide platform 22.

Particularly, in order to provide the vertical alignment of the optical axis of the light emitting surface 218a and the optical waveguide (core layer) 223 of the planar waveguide platform 22, as shown in FIG. 2, the upper clad layer 224 of the planar waveguide platform 22 has bonding regions 217a and 217b formed thereon by removing some portion of the upper clad layer 224 to a predetermined depth $d_{etch}$. When removing some region of the upper clad layer 224, the depth $d_{etch}$ can be appropriately controlled according to a height ($H_{etch}$ of FIG. 4b) of the first structure 21a of the semiconductor laser 11. As such, in accordance with the present invention, for the vertical alignment of the optical axis of the semiconductor laser 21 and the planar waveguide platform 22, instead of forming a separate terrace on the region A to which the semiconductor laser 21 is flip-chip bonded, some portion of the upper clad layer 224 is removed to an appropriate depth, thereby simplifying the process of manufacturing the hybrid type integrated optical device, and reducing manufacturing costs of the hybrid type integrated optical device.

Moreover, since the total length of the conventional semiconductor laser is determined by the cleaving process as described above, the semiconductor laser has an error of 30 µm or more in length due to inaccuracy of the cleaving process, and thus an error of 30 µm or more is created in the air gap 24. On the contrary, according to the present invention, since the first structure 21a is provided through an etching process, the length of the first structure 21a has an error determined depending on the accuracy of the semiconductor photolithography process used in the etching process. Since the semiconductor photolithography process creates an error of about 1 µm, the length of the first structure 21a has an error of about 1 µm, and thus, considering that an error of a typical flip-chip bonding process is about 2 µm, the size of the air gap 24 can be controlled to be about 3 µm. As such, according to the present invention, since the size of the air gap can be reproducibly and accurately controlled, optical coupling efficiency can be enhanced, and since the space necessary for the optical mode size converter formed in the semiconductor laser 21 can be reduced, the price of the semiconductor laser 21 can also be reduced.

Figure 5:
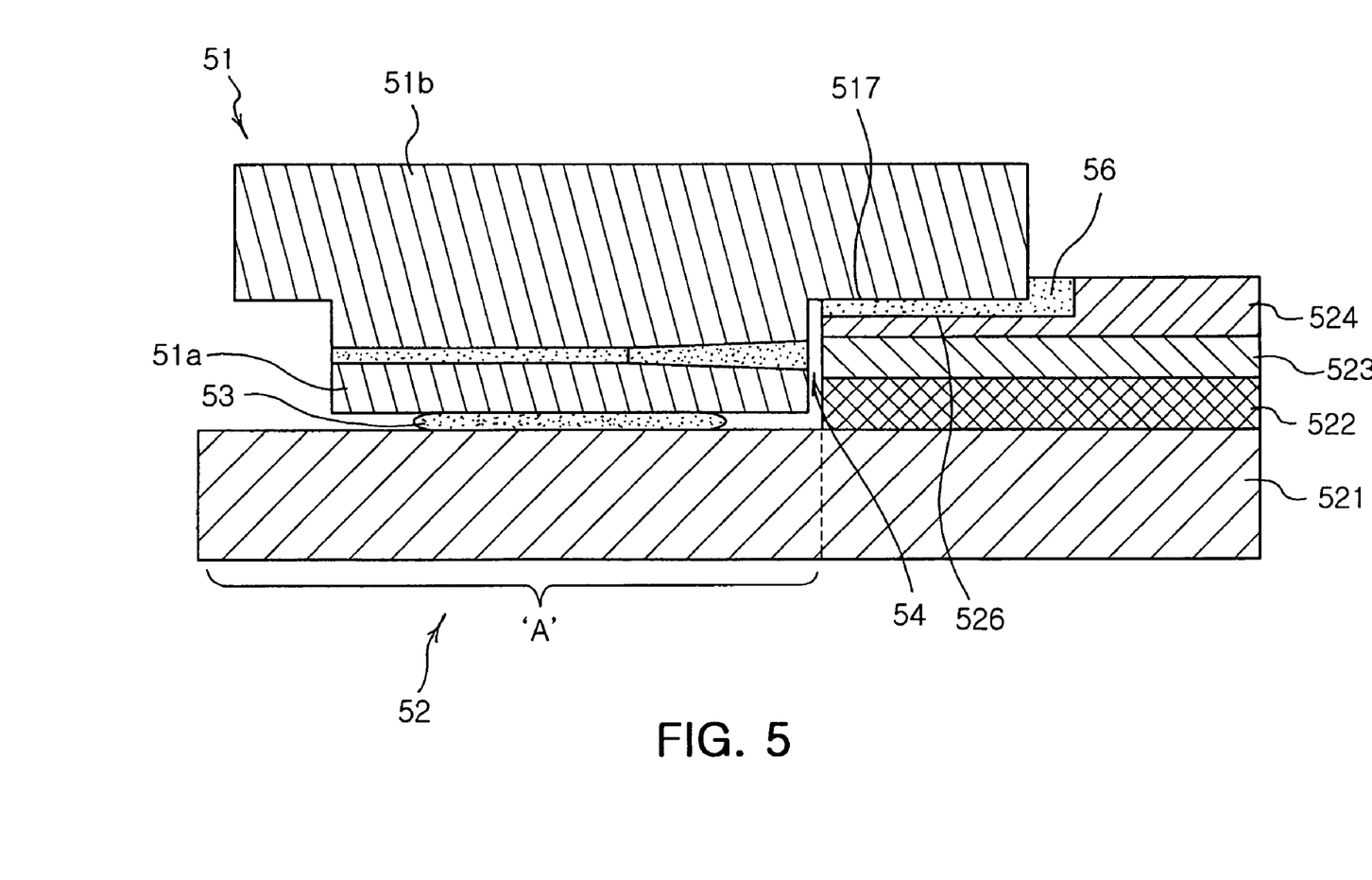
FIG. 5 is a cross-sectional view illustrating a hybrid type integrated optical device according to another embodiment of the present invention.

FIG. 5 is a cross-sectional view illustrating a hybrid type integrated optical device according to another embodiment of the present invention. The hybrid type integrated optical device 50 has a region A for flip-chip bonding a semiconductor laser 51 to one side of a planar waveguide platform 52, and is structured that an upper surface 517 of a second structure 51b at a light emission surface side of the semiconductor laser 51 contacts an upper clad layer 524 of the planar waveguide platform 52. Some region 526 of the upper clad layer 524 can be etched to a predetermined depth for vertical alignment of any optical axis of the semiconductor laser 51, and the upper surface 517 of the second structure 51b of the semiconductor laser 51 is bonded to the etched region 526 of the upper clad layer 524. An antireflection film and a high-reflection film may be coated on a light emission surface and the other side surface opposite to the light emitting surface, respectively.

In particular, since intimate contact between the uppersurface 517 of the second structure 51*b* of the semiconductor laser 51 and the etched region 526 of the upper clad layer 524 cannot be ensured due to surface roughness, a process error, and the like, a filling material 56 such as epoxy and the like may be filled between these two surfaces in order to enhance bonding strength. A material available for the filling material 56 includes a thermosetting epoxy material, an ultraviolet (UV) cured epoxy material, and the combination thereof, and in particular, the thermosetting epoxy material is most preferably used for the filling material. Illumination of UV light from the outside is the requirement for curing the UV cured epoxy material. However, semiconductor materials constituting the hybrid type integrated optical device have poor UV transmission characteristics, and the UV cured epoxy material is insufficiently cured due to difficulty in illumination on the overall filling material between the surfaces caused by its structure. Accordingly, the thermosetting epoxy material is more preferred.

Figure 6:
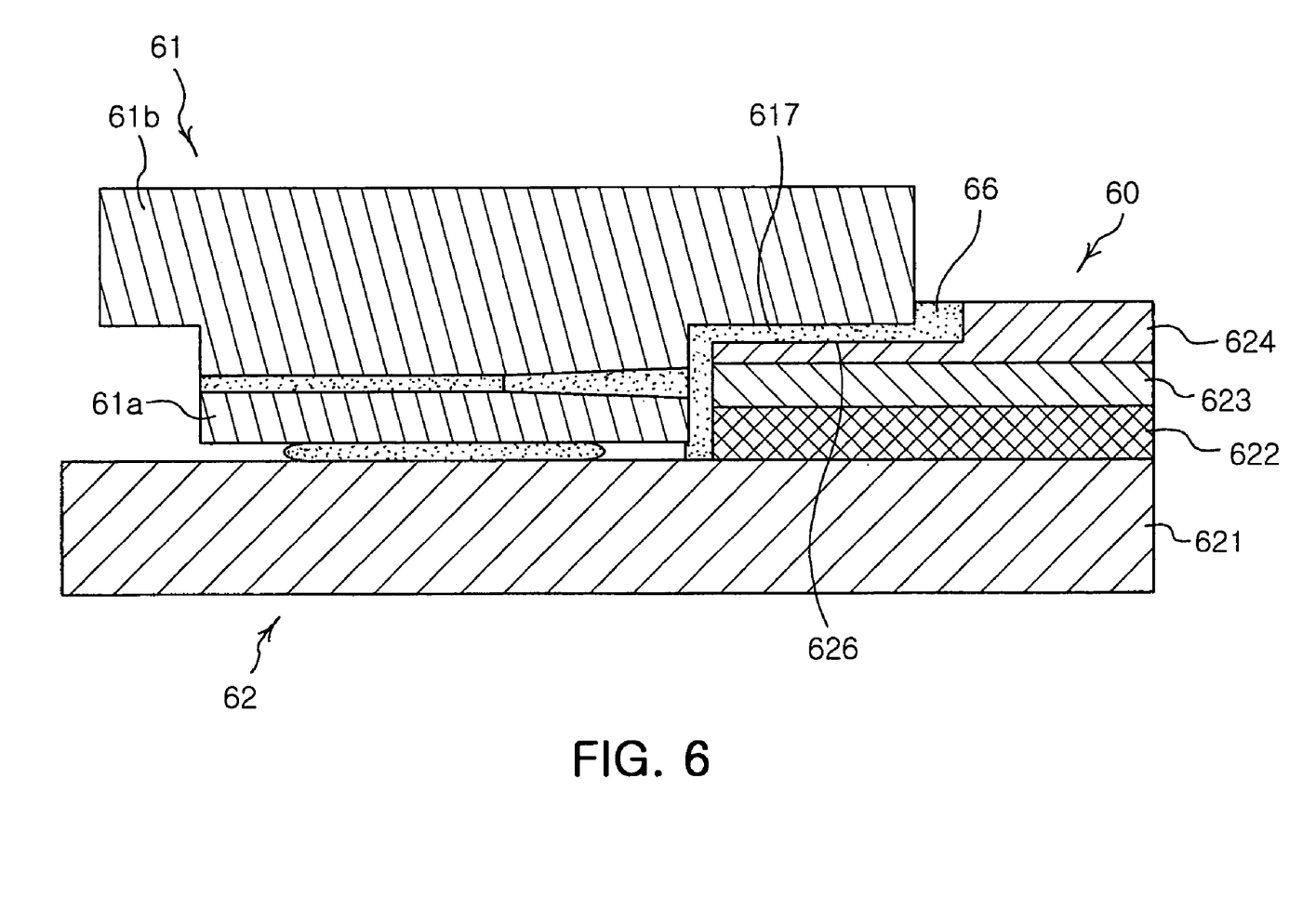
FIG. 6 is a cross-sectional view illustrating a hybrid type integrated optical device according to still another embodiment of the present invention.

FIG. 5 show the embodiment of the present invention wherein the filling material 56 is filled between the upper surface 517 of the second structure 51*b* of the semiconductor laser 51 and the upper clad layer 524 of the planar waveguide platform 52, and wherein the air gap is formed between the first structure 51*a* of the semiconductor laser and the planar waveguide platform. Meanwhile, according to another embodiment of the invention shown in FIG. 6, a filling material 66 may be filled in an air gap between a first structure 61*a* of a semiconductor laser 61 and a planar waveguide platform 62. Since light is propagated to the air gap and optical coupling occurs in the air gap, it is desirable for the filling material of the embodiment to use an index-matching epoxy material, which has a low difference in effective refractive index from that of an optical waveguide (core layer) 623 of the planar waveguide platform 62. More specifically, the filling material preferably has an effective refractive index of 1.3~1.7 for an optical communication wavelength in the range of 1,260~1,650 nm, and most preferably, the difference between the effective refractive index of the filling material and that of the optical waveguide (core layer) 623 is 0.1 or less.

Figure 7:
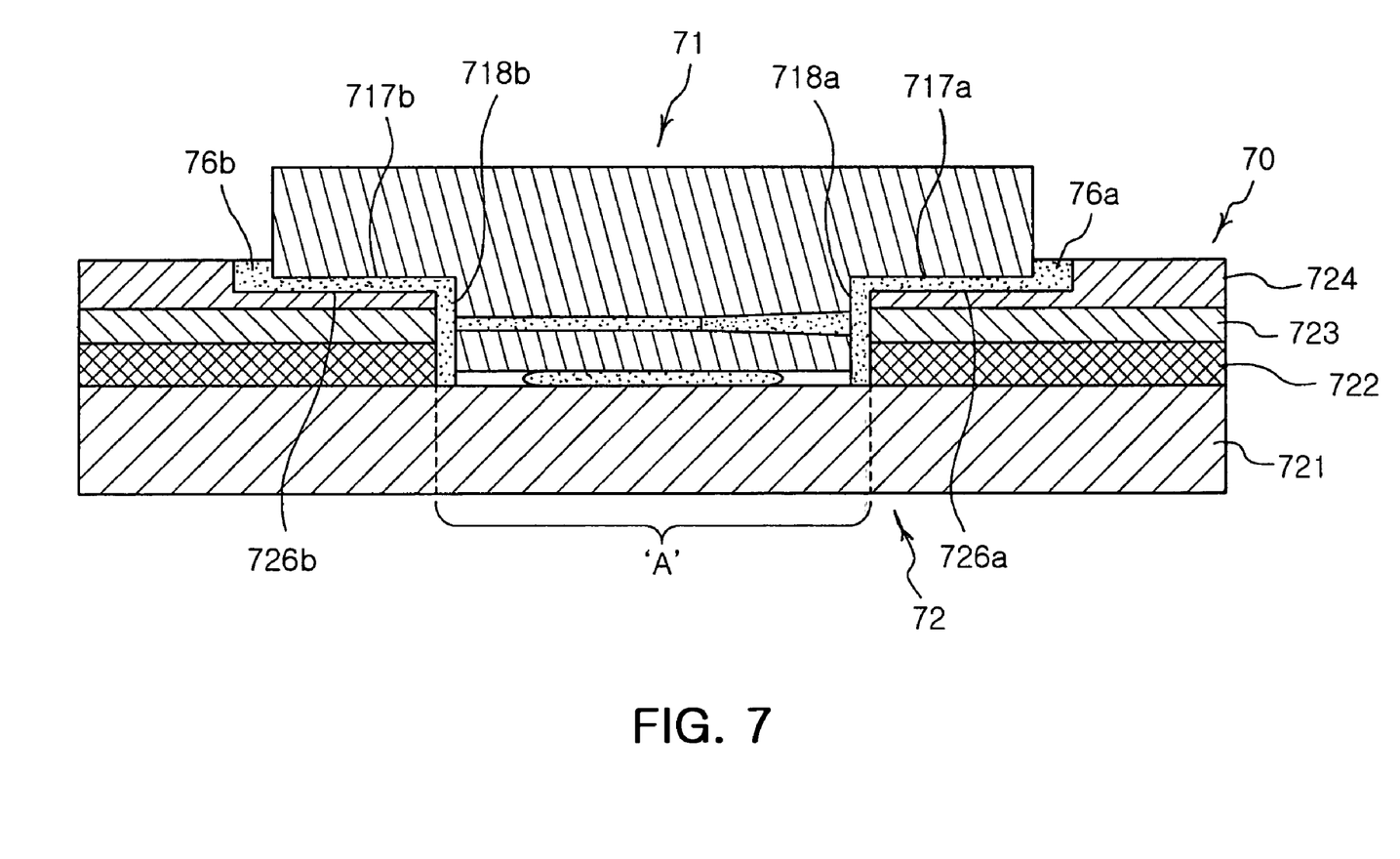
FIG. 7 is a cross-sectional view illustrating a hybrid type integrated optical device according to another embodiment of the present invention.

FIG. 7 shows a hybrid type integrated optical device according to still another embodiment of the invention, wherein the hybrid type integrated optical device has a region A for flip-chip bonding a semiconductor laser 71 to the center of a planar waveguide platform 72, and is structured such that both upper surfaces 717*a* and 717*b* of a second structure 71*b* contact an upper clad layer 724 of the planar waveguide platform 72. Some regions 726*a* and 726*b* of the upper clad layer 724 can be etched to a predetermined depth for vertical alignment of an optical axis of the semiconductor laser 71, and the upper surfaces 717*a* and 717*b* of the second structure 71*b* of the semiconductor laser 71 are bonded to the etched regions 726*a* and 726*b* of the upper clad layer 724. In the present embodiment, a filling material 76*a* and 76*b* may also be filled between the semiconductor laser 71 and the planar waveguide platform 72 in order to enhance bonding strength. Since optical coupling occurs in a region between a light emission surface 718*a* and the planar waveguide platform 72, as for the filling material 76*a* used for this region, it is desirable to use an index-matching epoxy material, which has a low difference in effective refractive index from that of an optical waveguide (core layer) 723 of the planar waveguide platform 72. More specifically, the filling material preferably has an effective refractive index of 1.3~1.7 for an optical communication wavelength in the range of 1,260~1,650 nm, and most preferably has an effective refractive index within 0.1 of the effective refractive index of the optical waveguide (core layer) 723. Both the index-matching epoxy material and an epoxy material having a different refractive index may be used between the other side surface opposite to the light emission surface 718*a* and the planar waveguide platform 72.

Figure 8:
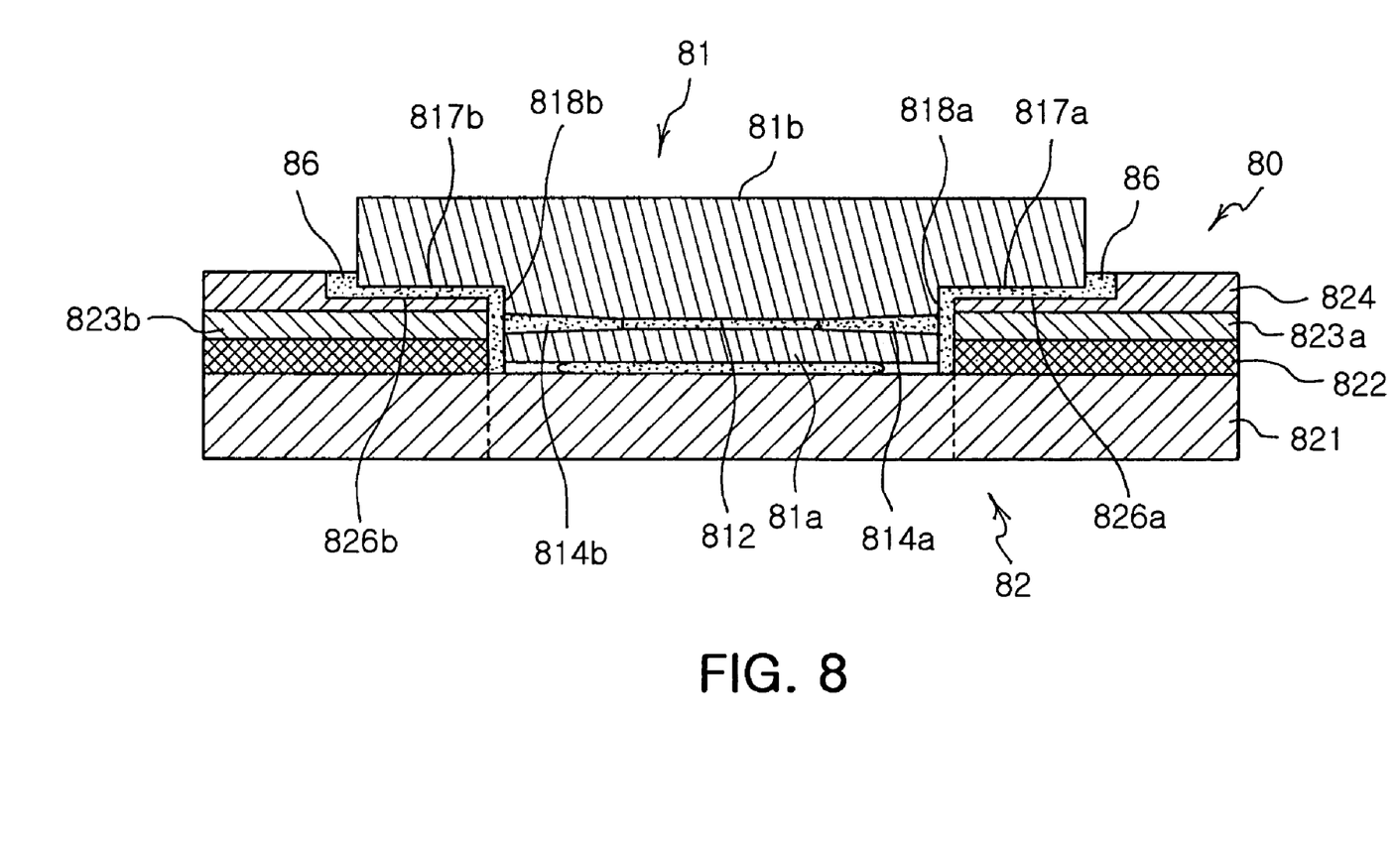
FIG. 8 is a cross-sectional view illustrating a hybrid type integrated optical device according to yet another embodiment of the present invention.

FIG. 8 shows a hybrid type integrated optical device according to yet another embodiment of the invention. A semiconductor laser 81 used in the hybrid type integrated optical device of the present embodiment has two light emission surfaces 818*a* and 818*b*. Optical mode size converters 814*a* and 814*b* are formed at both side surfaces of an active region 812 located at the center of a first structure 81*a* of the semiconductor laser 81, and light generated from the active region 812 is emitted to both side surfaces of the first structure 81*a*. In the present embodiment, since the light is emitted to both side surfaces of the first structure 81*a*, optical coupling occurs at both side surfaces of the first structure 81*a*. Accordingly, a filling material 86 between the light emission surfaces 818*a* and 818*b* of the first structure 81*a* and a planar waveguide platform 72 preferably has an effective refractive index within 0.1 of the effective refractive index of the optical waveguides 823*a* and 823*b*.

Figure 9:
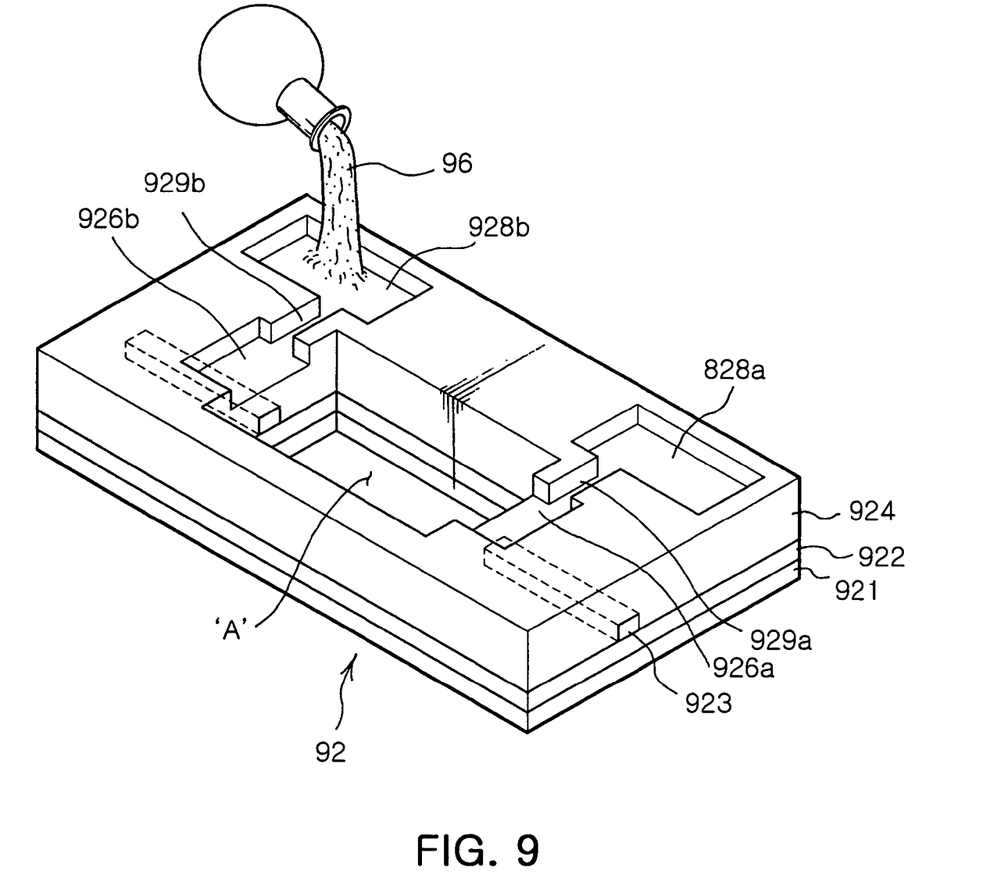
FIG. 9 is a perspective view illustrating one example of a planar waveguide platform according to the present invention.

FIG. 9 is a perspective view illustrating one example of a planar waveguide platform to which the filling material is provided. As described above, a planar waveguide platform 92 is provided with a region A to which a semiconductor laser is flip-chip bonded, and some regions of an upper clad layer 924 at both side surfaces of the flip-chip bonding region A are removed to a predetermined depth, thereby providing bonding regions 926*a* and 926*b* to which upper surfaces of a second structure of the semiconductor laser are bonded. In addition to the bonding regions 926*a* and 926*b*, the planar waveguide platform 92 may have filling material conserving regions 928*a* and 928*b* formed by removing some portions of the upper clad layer 924 to a predetermined depth, and trench regions 929*a* and 929*b* formed by removing other portions of the upper clad layer 924 to a predetermined depth between the filling material conserving regions 928*a* and 928*b* and the bonding regions 926*a* and 926*b* for connecting these regions, respectively. As with the bonding regions 926*a* and 926, the filling material conserving regions 928*a* and 928*b* and the trench regions 929*a* and 929*b* may be formed by a dry etching process.

In such a structure, when a filling material 96 flows to the filling material conserving regions 928*a* and 928*b*, the filling material 96 flows to the bonding regions 926*a* and 926*b* along the trench regions 929*a* and 929*b*. The filling material is provided to fine spaces between the bonding regions 926*a* and 926*b* and the upper surfaces of the second structure of the semiconductor laser contacting the bonding regions 926*a* and 926*b* by virtue of a capillary phenomenon. The filling material may also be provided to a space (air gap) between the side surface of the first structure and the side surface of the planar waveguide platform facing the side surface of the first structure by appropriately controlling a filling time, a viscosity of the filling material, and an amount of the filling material. As described above, the filling material includes a thermosetting epoxy material, an ultraviolet (UV) cured epoxy material, and the combination thereof, and in particular, the thermosetting epoxy material is most preferably used for the filling material.

As apparent from the above description, according to the present invention, the hybrid type integrated optical device is structured such that the size of the space (air gap) between the light emission surface of the semiconductor laser and the side surface of the planar waveguide platform facing the light emission surface is reproducibly reduced to 3 µm or less, thereby enhancing the optical coupling efficiency between the light emitted from the semiconductor laser and the optical waveguide in the planar waveguide platform. Moreover, the space necessary for the optical mode size converter formed in the semiconductor laser can be reduced, thereby reducing the price of the semiconductor laser.

Furthermore, according to the present invention, the vertical alignment of the optical axis can be achieved by removing some portion of the upper clad layer to a predetermined depth without forming additional terrace on the region to which the semiconductor laser is flip-chip bonded for the vertical alignment of the optical axis with the planar waveguide platform, thereby simplifying the manufacturing process of the optical device and reducing the price of the optical device.

Furthermore, according to the present invention, the air gap between the semiconductor laser and the planar waveguide platform is filled with the filling material, thereby preventing the optical coupling efficiency from being lowered due to contamination caused by dust, moisture, and the like.

It should be understood that the embodiments and the accompanying drawings have been described for illustrative purposes and the present invention is limited by the following claims. Further, those skilled in the art will appreciate that various modifications, additions and substitutions are allowed without departing from the scope and spirit of the invention as set forth in the accompanying claims.

What is claimed is:

1. A hybrid type integrated optical device, comprising:
   a semiconductor laser including a first structure having an active region and a light emission surface formed on at least one side surface of the first structure, and a second structure formed below the first structure and having upper surfaces exposed at the light emission surface of the first structure and at a side surface opposite to the light emitting surface; and
   a planar waveguide platform including a substrate, a lower clad layer, a core layer, an upper clad layer, being sequentially stacked in this order on the substrate such that some region of the substrate is exposed, and a metallic pattern formed on the exposed region of the substrate,
   wherein the semiconductor laser is flip-chip bonded to the metallic pattern, such that the exposed upper surfaces of the second structure contact a recessed region of an upper surface of the upper clad layer of the planar waveguide platform and remain partially exposed.

2. The optical device as set forth in claim 1, wherein the semiconductor laser has a planar buried hetero-junction structure.

3. The optical device as set forth in claim 1, wherein the semiconductor laser further includes an optical mode size converter between the active region and the light emission surface.

4. The optical device as set forth in claim 1, wherein the first structure has a height of 6 µm or more.

5. The optical device as set forth in claim 1, wherein the semiconductor laser further includes an antireflection film coated on the light emission surface, and a high-reflection film coated on the other side surface opposite to the light emission surface.

6. The optical device as set forth in claim 1, wherein the recessed region is a bonding region formed by removing some portion of the upper clad layer to a predetermined depth, the semiconductor laser is flip-chip bonded to the bonding region such that the exposed upper surfaces of the second structure are bonded to an upper surface of the bonding region, whereby vertical alignment of an optical axis between the semiconductor laser and the planar waveguide platform is achieved by controlling the depth of the bonding region.

7. The optical device as set forth in claim 1, wherein the semiconductor laser is flip-chip bonded to the metallic pattern by means of a filling material filled between the exposed upper surfaces of the second structure and the upper surface of the upper clad layer of the planar waveguide platform.

8. The optical device as set forth in claim 1, wherein the semiconductor laser is flip-chip bonded to the metallic pattern by a filling material filled between the exposed upper surfaces of the second structure and the upper clad layer of the planar waveguide platform and between a side surface of the first structure and a side surface of the planar waveguide platform facing the side surface of the first structure.

9. The optical device as set forth in claim 6, wherein the semiconductor laser is flip-chip bonded to the metallic pattern by a filling material filled between the exposed upper surfaces of the second structure and the upper surface of the upper clad layer of the planar waveguide platform.

10. The optical device as set forth in claim 6, wherein the semiconductor laser is flip-chip bonded to the metallic pattern by a filling material filled between the exposed upper surfaces of the second structure and the upper clad layer of the planar waveguide platform and between a side surface of the first structure and a side surface of the planar waveguide platform facing the side surface of the first structure.

11. The optical device as set forth in any one of claims 7 to 10, wherein the filling material is an epoxy material selected from the group consisting of a thermosetting epoxy material, an ultraviolet cured epoxy material, and the combination thereof.

12. The optical device as set forth in claim 8 or 10, wherein the filling material has an effective refractive index within 0.1 of the effective refractive index of the core layer of the planar waveguide platform.

13. The optical device as set forth in claim 9 or 10, wherein the planar waveguide platform includes at least one filling material conserving region formed by removing some portion of the upper clad layer to a predetermined depth, and at least one trench region formed by removing the upper clad layer to a predetermined depth between the filling material conserving region and the bonding region, and the filling material conserved in the filling material conserving region flows to the bonding region along the trench region so as to be filled between the exposed upper surfaces of the second structure and the upper surface of the bonding region of the upper clad layer of the planar waveguide platform, and between the side surface of the first structure and the side surface of the planar waveguide platform facing the side surface of the first structure.

* * * * *